United States Patent [19]

Rose

[11] Patent Number: 5,228,963

[45] Date of Patent: Jul. 20, 1993

[54] HOLLOW-CATHODE MAGNETRON AND METHOD OF MAKING THIN FILMS

[75] Inventor: Peter W. Rose, San Carlos, Calif.

[73] Assignee: Himont Incorporated, Wilmington, Del.

[21] Appl. No.: 724,007

[22] Filed: Jul. 1, 1991

[51] Int. Cl.⁵ .......................................... C23C 14/34
[52] U.S. Cl. .................... 204/192.12; 204/298.11; 204/298.14; 204/298.21; 204/298.22; 204/298.23; 204/298.24; 204/298.28
[58] Field of Search ...................... 204/192.12, 298.11, 204/298.12, 298.14, 298.21, 298.22, 298.23, 298.24, 298.28

[56] References Cited

U.S. PATENT DOCUMENTS

| | | | |
|---|---|---|---|
| 3,884,793 | 5/1975 | Penfold et al. | 204/298.21 X |
| 4,322,276 | 3/1982 | Meckel et al. | 204/298.24 X |
| 4,407,713 | 10/1983 | Zega | 204/298.22 |
| 4,500,408 | 2/1985 | Boys et al. | 204/298.2 X |
| 4,530,750 | 7/1985 | Aisenberg et al. | 204/298.24 |
| 4,622,121 | 11/1986 | Wegmann et al. | 204/298.22 X |
| 4,880,515 | 11/1989 | Yoshikawa et al. | 204/298.19 X |
| 4,966,677 | 10/1990 | Aichert et al. | 204/298.21 |

Primary Examiner—Nam X. Nguyen
Attorney, Agent, or Firm—Robert O. Guillot

[57] ABSTRACT

A hollow-cathode magnetron for the deposition of a film upon a filament like material. A localized plasma is struck within a hollow cylindrical target to sputter material onto said filament. The localized plasma is moved around said target, such that the target is uniformly sputtered and the filament is uniformly coated. The creation and movement of the localized plasma is accomplished utilizing a plurality of bar magnets which rotate around the target, whereby the localized plasma rotates around the sputtering bore of the target. A water jacket surrounds the target and functions to cool the target. Because the plasma is localized, significant portions of the target are advantageously cooled when not being sputtered, such that higher throughput can be obtained. The invention also includes a sputtering shield which functions to inhibit the buildup of a sputtered film upon the electrically active elements, whereby the creation of electrical shorts is prevented.

37 Claims, 3 Drawing Sheets

Fig_1

HOLLOW-CATHODE MAGNETRON AND METHOD OF MAKING THIN FILMS

BACKGROUND OF THE INVENTION

1. Field of the Invention

The present invention relates generally to plasma magnetrons that are utilized in sputtering processes, and more particularly to magnetrons having a hollow cathode wherein the object to be coated passes through the center of the hollow cathode.

2. Brief Description of the Prior Art

Vacuum metallization by sputtering is commonly accomplished by a planar magnetron configuration because of the high rates this technique offers compared to other sputtering techniques. In the planar magnetron, a planar target is backed with magnets to enhance and confine the plasma. A limitation of planar magnetrons is that the sputtering is most aggressive near the plasma zones, and thus the target is inefficiently utilized. Secondly, the power and thus the deposition rate is limited by the maximum temperature which the target sustains. Therefore, for high throughput systems an incentive exists for increasing cooling effectiveness. Another limitation of planar magnetrons is that they are relatively wasteful when attempting to deposit films upon fibers or other small objects.

Recently, improvements to such systems have been built which utilize a rotating cylindrical cathode target with fixed interior magnets. Such a device is taught in U.S. Pat. No. 4,356,073 issued Oct. 26, 1982 to McKelvey. The result is a uniform etch of the outer surface of the cylindrical cathode target across most of its length, offering efficient use of the target. Secondly, run times between target changes are increased dramatically. If target cooling is accomplished by passing water through the center of the cylindrical target the power can be increased, potentially raising the sputtering rate due to more efficient cooling. However, as with planar targets, significant waste occurs when attempting to deposit thin films upon fibers and other small objects.

In order to improve the coating of the fibers, yarns, wires and other continuous objects a hollow cathode target configuration has been employed successfully. The hollow cathode has a cylindrical target which is designed to sputter in the interior. The advantages of the hollow cathode is that most of the over spray collects on the opposite side of the target, dramatically increasing the material usage. Hollow cathodes are also advantageous because cooling the outside of the cylinder is very efficient, and because the system sputters all around the substrate, resulting in a uniform coating.

Magnetically enhanced hollow cathode magnetrons exist in which cylindrical electromagnets are placed concentrically along portions of the length of the target. Such a device is taught in U.S. Pat. No. 4,966,677, issued Oct. 30, 1990 to Alchert et al. The target is consumed at the greatest rates between the magnets where the plasma is most intense. Sectioned cathodes have been used which minimizes affect on material usage by swapping highly worn sections with those which have little wear. A drawback of such devices is that targets are costly due to additional machining, and the system must be shut down to be rebuilt during or between runs.

SUMMARY OF THE INVENTION

It is an object of the present invention to provide a hollow-cathode magnetron exhibiting uniform consumption of the cathode target.

It is another object of the present invention to provide a hollow-cathode magnetron having improved water flow cathode cooling characteristics.

It is a further object of the present invention to provide a hollow-cathode magnetron having a magnetic means that is disposed to cause the creation of localized plasma zones to influence target sputtering.

It is yet another object of the present invention to provide a hollow cathode magnetron having a magnetic means and a target that are movable relative to each other, such that movable plasma zones are created proximate the target walls.

It is yet a further object of the present invention to provide a hollow-cathode magnetron having a plurality of bar magnets engaged to a rotating outer concentric cylindrical housing, whereby the movement of localized plasma zones relative to the target is achieved and the consumption of target material is uniformly accomplished.

It is yet another object of the present invention to provide a sputter shield that is disposed proximate a target and an electrical element, to shield the electrical element from unwanted film deposition and thereby prevent electrical shorts from occurring.

The hollow-cathode magnetron includes a hollow cylindrical cathode target. A continuous object, such as a fiber is passed axially through the target, along its central axis. Deposition material is sputtered from the inner surface of the target to form a thin film coating on the fiber as it passes through the cylindrical target.

An outer cylindrical housing is disposed in axial alignment with the cylindrical target. A plurality of bar magnets are engaged to the inner wall of the housing to project radially inwardly within the space between the inner surface of the housing and the outer surface of the cylindrical target. The housing with its attached magnets is rotatably engaged relative to the target, such that the housing and its engaged magnets rotate about the central axis of the target. In the preferred embodiment a target holding structure is formed as a water jacket that is adapted to be filled with cooling water, whereby the target may be cooled to increase deposition rates and throughput.

A plasma forming gas is introduced into the hollow cylindrical target and a suitable electrical potential is established between the cathode target and the anode, such that a plasma is generated within the target to sputter material from the inner surface of the target. The magnets serve to localize the plasma forming region proximate the inner surface of the target to increase sputtering rates from the target. The rotation of the magnets around the target promotes uniform sputtering from the inner surface of the target over time, thereby prolonging the useful life of the target and increasing overall throughput of the device.

Alternative embodiments include the utilization of a plurality of electromagnets which fully surround the target, and which are sequentially energized to move a localized magnetic field around the target bore. Additionally, it is contemplated that the bar magnets may be fixedly engaged and the target may be movably engaged relative to the magnets.

A sputter shield is installed proximate the target and the anode to inhibit deposition upon the anode and prevent electrical shorts from occurring.

It is an advantage of the present invention that it provides a hollow cathode magnetron exhibiting uniform consumption of the cathode target.

It is another advantage of the present invention that it provides a hollow-cathode magnetron having improved water flow cooling characteristics.

It is a further advantage of the present invention that it provides a hollow-cathode magnetron having a magnetic means that is disposed to cause the creation of localized plasma zones to influence target sputtering proximate the zones.

It is yet another advantage of the present invention that it provides a hollow-cathode magnetron having a magnetic means and a target that are movable relative to each other, such that a movable plasma zone is created proximate the target walls.

It is yet a further advantage of the present invention that it provides a hollow-cathode magnetron having a plurality of bar magnets engaged to a rotating outer concentric cylindrical housing, whereby the movement of localized plasma zones relative to the target is achieved and the consumption of target material is uniformly accomplished.

It is yet another advantage of the present invention that it provides a sputter shield that is disposed proximate a target and an electrical element, to shield the electrical element from unwanted film deposition and thereby prevent electrical shorts from occurring.

The foregoing and other objects, features and advantages of the present invention will be apparent from the following detailed description of the preferred embodiment which makes reference to the drawing.

DETAILED DESCRIPTION OF THE PREFERRED EMBODIMENT

Figure 1:
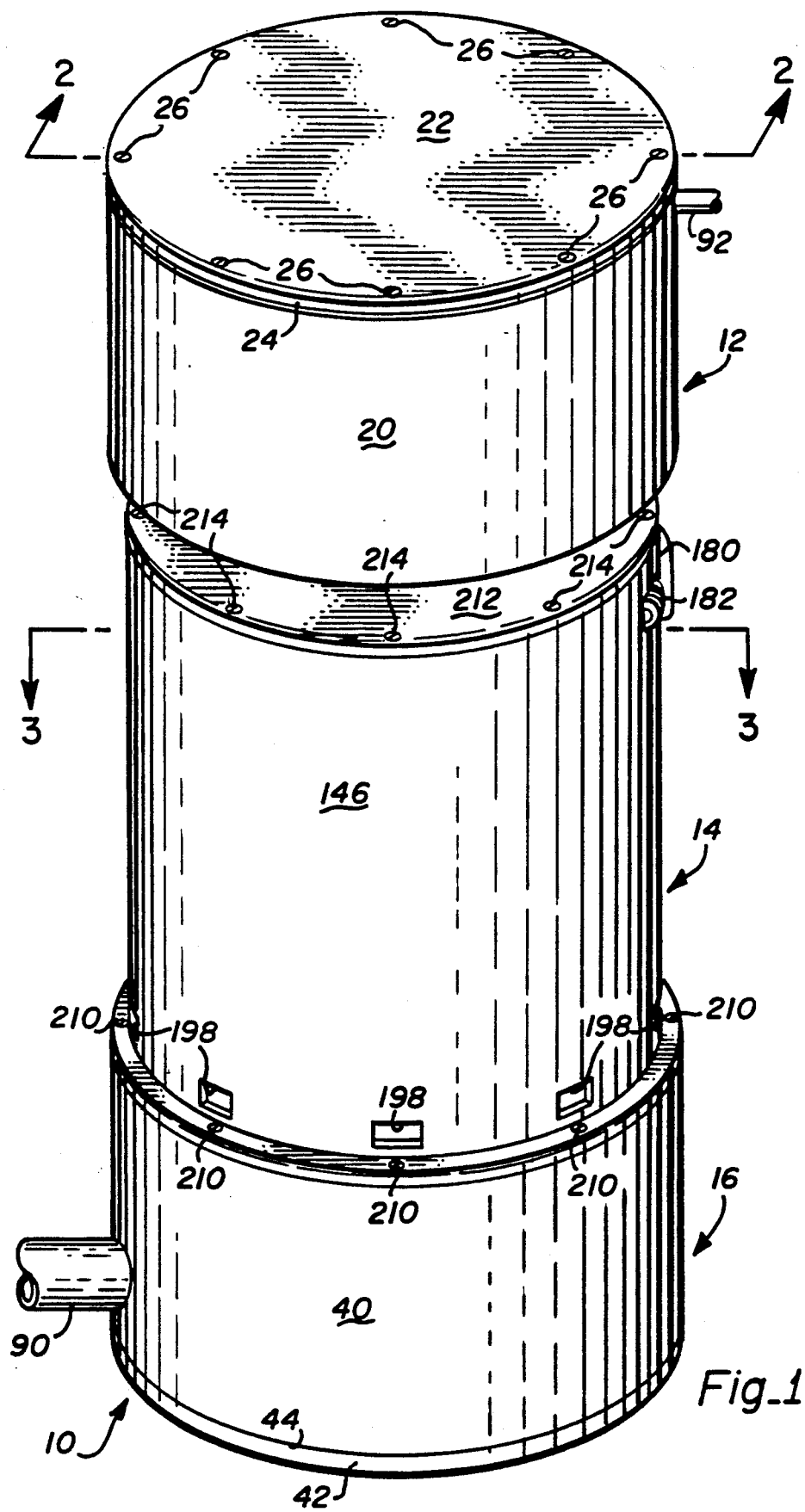
FIG. 1 is a perspective view of the rotating hollow-cathode magnetron of the present invention.
Figure 2:
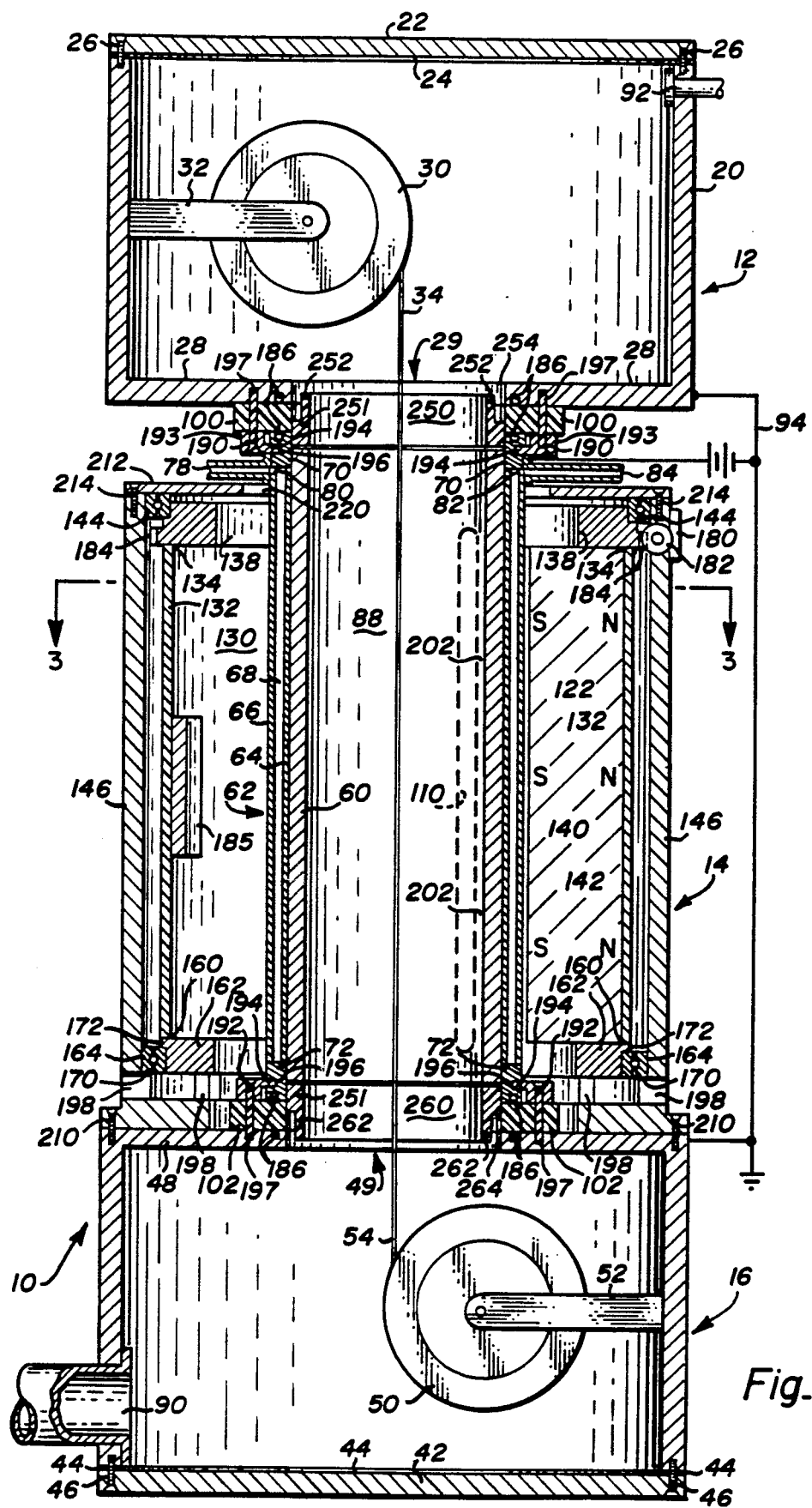
FIG. 2 is a side cross-sectional view of the rotating hollow-cathode magnetron of the present invention taken along lines 2—2 of FIG. 1.
Figure 3:
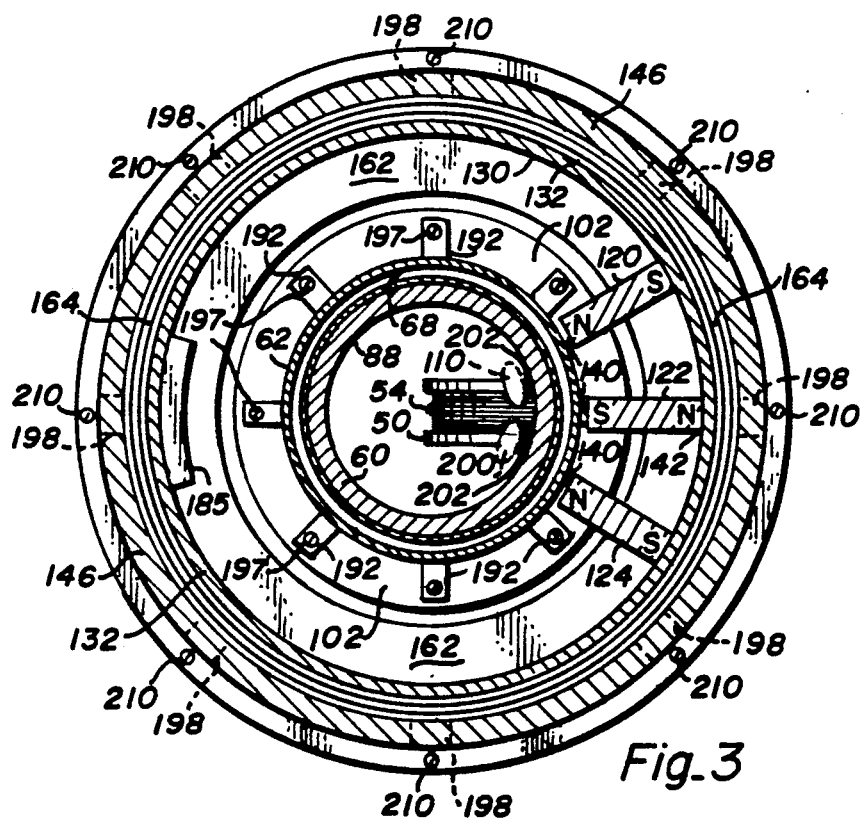
FIG. 3 is a top cross-sectional view of the device depicted in FIG. 1 taken along lines 3—3 of FIG. 1.

FIG. 1 is a perspective view of the rotating hollow-cathode magnetron 10 of the present invention; FIG. 2 is a side cross-sectional view, taken along lines 2—2 of FIG. 1, and FIG. 3 is a top cross-sectional view, taken along lines 3—3 of FIGS. 1 and 2. The magnetron 10 is primarily suited for the deposition of a thin film upon a continuous fiber or filament which passes therethrough. As is depicted in FIGS. 1, 2 and 3, the magnetron 10 is a generally cylindrical device that is preferably utilized with its central axis disposed in the vertical orientation depicted in FIGS. 1 and 2. The magnetron 10 includes three basic sections, a generally hollow cylindrical input section 12, a centrally disposed deposition section 14 and a generally hollow cylindrical output section 16. The deposition section 14 is disposed between the input section 12 and output section 16.

As is best seen in FIG. 2, the input section 12 is preferably formed with cylindrical side walls 20 to which a solid end cap 22 is engaged. A vacuum seal 24 is disposed between the end cap 22 and the side walls 20 to promote the formation of a low pressure environment within the magnetron 10. A plurality of screws 26, which are threadably engaged in the side wall 20, are utilized to fasten the end cap 22 to the side walls 20. The side walls 20 are engaged at their inner ends to a radially inwardly projecting end wall 28 having a circular orifice 29 formed therethrough. An input spool 30 is mounted within the input end 12 upon a rotatable spool mounting structure 32 such that the coated input filament 34 plays out from the spool 30 along the central axis of the cylindrical deposition section 14 of the magnetron 10.

The output section 16 of the magnetron 10 is substantially similar in its physical configuration to the input section 12. The output section 16 includes cylindrical walls 40 to which an end cap 42 is engaged. A vacuum seal 44 is disposed between the end cap 42 and the side walls 40 to promote the formation of a low pressure environment within the magnetron 10. A plurality of screws 46, which are threadably engaged in the side wall 40, are utilized to fasten the end cap 42 to the side walls 40. The side walls 40 are engaged at their inner ends to a radially inwardly projecting end wall 48 having a circular orifice 49 formed therethrough. An output spool 50 is engaged to a spool mounting mechanism 52 whereby coated filament 54 that has passed through the deposition section 14 of the magnetron 10 is gathered. A spool motor (not shown) and line tension device (not shown) are used to pull the filament through the deposition section 14. Such spool motors and line tensioning devices are well known to those skilled in the art.

The deposition section 14 includes a centrally disposed hollow cylinder sputtering target 60, having its central axis in coaxial alignment with the magnetron 10. As is seen in FIGS. 2 and 3, the fiber to be treated passes from the input spool 30 to the output spool 50 along the central axis of the hollow target 60. The target 60 is engaged within the cylindrical walls of a target holding jacket member 62. In the preferred embodiment, the jacket member 62 is formed with two coaxial cylindrical walls 64 and 66 having a narrow space disposed therebetween. The upper and lower ends of the walls 64 and 66 are engaged to an upper jacket end cap 70 and a lower jacket end cap 72 respectively. The space 68 between the cylindrical walls 64 and 66 serves as a target cooling jacket, and a liquid coolant, such as water, is introduced through an input pipe 78 to an input bore 80 formed in the upper end cap 70 in communication with the jacket coolant space 68. The coolant water is output through an outlet bore 82 formed in the upper end cap 70 in communication with the jacket coolant space 68 to an output pipe 84.

It is the function and purpose of the magnetron 10 to create a plasma within the deposition section 14 proximate the Walls of the hollow target 60. The plasma functions to sputter material from the inner wall 88 of the target 60 to coat the filament as it passes through the target 60. To facilitate the creation of a plasma, a vacuum pump (not shown) is engaged to the vacuum port 90 formed through the wall 40 of the output end 16, and a plasma gas inlet port 92 is formed through the wall 20 of the input end 12. A plasma generating gas is therefore held within the magnetron 10 at an appropriate pressure for creating a plasma.

A suitable electrical potential for creating a plasma is achieved by electrically configuring the end sections 12 and 16 as anodes and the target 60 as a cathode. FIG. 2 contains a simple electrical schematic 94 which depicts the basic DC electrical connections. In the preferred embodiment, the walls 20 and 40 are electrically conductive, as are the jacket end caps 70 and 72 and walls 64 and 66 of the cooling jacket 62. In the preferred embodiment, and in typical utilizations, the target 60 is also electrically conductive. An insulating ring 100 is disposed between the end wall 28 and the jacket cap 70 to electrically isolate the anode 12 and cathode 60. Likewise, an insulating ring 102 is disposed between the end wall 48 and the jacket cap 72 to maintain electrical isolation between the anode 16 and cathode 60. Of course, as is well known, RF electrical excitation could be utilized to establish a plasma, and the present invention is not limited to the DC electrical connection depicted in FIG. 2.

A magnetic means for influencing the plasma is utilized to cause the plasma to be created in localized areas or zones 110 within the target 60. In the present invention, the magnetic means and the target 60 are movable relative to each other, such that the position of the plasma zone 110 relative to the inner surface 88 of the target 60 can be altered. The movement of the plasma zone 110 around the target surface 88 permits both a more uniform utilization of the target 60 and time for additional cooling of the target 60 in areas away from the plasma zone 110.

In the preferred embodiment the magnetic means includes three generally rectangular bar magnets 120, 122 and 124 that are affixed to the inner surface 130 of a cylindrical housing 132. The bar magnets 120, 122 and 124 are disposed such that a longitudinal edge 140 of each bar magnet is disposed nearest to and is parallel to the central axis of the cylindrical target 60. The polarity of each bar magnet is such that one longitudinal edge (such as edge 140) is of one polarity, and the other opposing longitudinal edge (such as edge 142) is of the opposite polarity. The three bar magnets 120, 122 and 124 are arranged in alternating polarity resulting in a north-south-north configuration for the corresponding longitudinal edges 140 of the bar magnets 120, 122 and 124 respectively as depicted in FIGS. 2 and 3. It is within the contemplation of the inventors that less than three or more than three such magnets may be utilized in a group of magnets, and that a plurality of groups of magnets may be engaged to the inner surface 130 of the housing 132, such as a corresponding set of bar magnets that would be diametrically disposed relative to magnets 120, 122 and 124. It is also within the contemplation of the invention that a race track type of magnetic grouping may be utilized. Such a race track includes a central magnet of shortened length, surrounded by a rectangular continuous magnet. The polarity of the longitudinal edge of the central magnet differs from the polarity of the continuous inner edge of the rectangular magnet.

The housing 132 is rotatably mounted within the magnetron 10 to rotate coaxially about the central axis of the target 60, whereby the magnets 120, 122 and 124, through their engagement with the inner surface 130 of the housing 132 rotate about the target 60. To accomplish its rotational motion, the housing 132 is engaged at its upper end 134 to a ring-shaped collar 138. The collar 138 is engaged to the inner race of a ring bearing 144, which has its outer race engaged to a cylindrical outer housing 146. The bearing 144 thus controls both the radial rotational movement and the axial displacement of the housing 132.

In like manner, the lower end 160 of the housing 132 is engaged to a lower ring-shaped collar 162. A ring bearing 164 is engaged between the collar 162 and the outer housing 146 to control both the radial rotational motion and the axial movement of the housing 132. The outer race of ring bearing 164 is engaged upon a lower, inwardly projecting shoulder portion 170 of the outer housing 146, and the inner race of ring bearing 164 is disposed within a shoulder 172 formed within the collar 162. It is therefore to be understood that the housing 132 with its engaged magnets 120, 122 and 124 is rotatably mounted on the bearings 144 and 164 within the fixed outer housing 146.

A motor 180 is engaged to the outer housing 146 to control the rotational motion of the inner housing 132. The motor 180 is engaged to a worm gear 182 which is enmeshed with a radially projecting toothed gear portion 184 of the upper collar 138, whereby rotational motion of the worm gear 182 will cause rotation of the collar 138 and the housing 132 which is engaged therewith. A balance weight 185 is engaged to the inner housing 132 diametrically opposite the magnets to achieve a balanced rotation of housing 132.

The outer housing 146 is engaged to the walls 40 of the output section 16 utilizing a plurality of screws 210. A disc shaped outer housing cover 212 is removably engaged to the upper edge of the walls of the outer housing 146 utilizing a plurality of screws 214. Removal of the cover 212 permits the installation and assembly of the rotatable inner housing 132 together with the bearings 164 and 144 within the outer housing 146. A relatively large hole 220 is centrally formed through the cover 212 to maintain electrical isolation between the water jacket 62 (held at the cathode potential) and the outer housing 146 (held at the anode or ground potential).

To maintain a low pressure environment within the magnetron 10, four O-ring seals 186 are disposed in O-ring grooves formed in the walls 28 and 48 and the end caps 70 and 72 to form appropriate seals proximate the insulator rings 100 and 102. A plurality of clamps 190 are utilized to removably engage the upper jacket end cap 70 with the insulating ring 100. Similar clamps 192 are utilized to engage the lower jacket end cap 72 to the insulating ring 102. Each of the clamp members 190 and 192 includes a base 193 and a projecting arm portion 194 that fits into a mating groove 196 formed in the outer surface of the jacket end caps 70 and 72. A screw 197 passes vertically through the base 193 of each clamp 190 and 192, and through aligned holes found in the insulator rings 100 and 102, to a threaded engagement in aligned blind, threaded holes formed in the end walls 28 and 48. The screws 197 and clamps 190 and 192 serve to apply clamping pressure upon the O-rings 186 and maintain the vacuum seal. When the screws 197 are loosened the clamps 190 and 192 are free to rotate about the screw 197, such that the projecting arm portion 194 becomes disengaged from the grooves 196. The screws 197 are composed of an electrically non-conductive material, such that electrical isolation between the anodes and cathode is maintained.

It is therefore to be realized that the clamps 190 may be displaced rotationally about screws 197 such that the arm members 194 are disengaged from the grooves 196, whereby the input section 12, together with insulator ring 100 may be removed from engagement with the upper jacket end cap 70. In like manner, the lower clamps 192 may be displaced rotationally about screws 197, such that the lower jacket end cap 72 is released from its engagement with the output section 16 and insulator ring 102. Mechanical access to the lower clamps 192 is facilitated laterally by clamp access windows 198 formed through the outer housing 146 at appropriate locations proximate the clamps 192, and downwardly through the space between hole 220 and the outer wall 66 of the jacket 62 when input section 12 is removed.

It is therefore to be realized that upon the rotational displacement of the clamps 190 and 192 that the water cooling jacket 62, together with the target 60, may be removed in an upward direction from the surrounding rotatable magnet housing 132. In this manner a replacement target cathode, in engagement with the cooling jacket 62, may be inserted into the magnetron 10.

In order to enhance the target cooling characteristics of the invention, in the preferred embodiment the target 60 is bonded to the water jacket 62 prior to insertion into the device 10. However, the invention is not to be so limited, and targets which obtain a tight fit with the water jacket upon heat expansion may be utilized.

As has been described hereinabove, a suitable electrical potential exists between the anodes 12 and 16 and the cathode 60, such that a plasma can be struck in the gaseous atmosphere within the target 60. The magnetic fields generated by the bar magnets 120, 122 and 124 serve to create localized plasma areas 110 proximate the inner wall 88 of the cathode target 60. Due to the alternating polarity of the longitudinal edges 140 of the magnets, the localized plasma areas 110 are in the form of long, narrow linear zones that are parallel to the longitudinal axis of the bar magnets, and therefore parallel to the central axis of the cathode target 60 and the filament 34.

In the preferred embodiment, a ring-shaped sputter shield 250 is disposed proximate the upper end of the target 60. The shield 250 is formed from an electrically non-conductive material and serves to prevent the buildup of sputtered material upon the inner surface of the insulator ring 100. The buildup of a layer of electrically conductive sputtered material upon the inner surface of the insulator ring 100 would cause an electrical short between the end cap 70 (at cathode potential) and the end wall 28 (at anode potential). Of course, the shield 250 also prevents the buildup of a dielectric coating on the anode where the target 60 is composed of a dielectric. The shield 250 includes a base 251 which engages the inner walls of the end cap 70 and an axially projecting leg portion 252 which is inwardly displaced relative to the end wall 28, such that an annular gap 254 is created. The leg 252 projects into the space between the anode end wall 28 and the target 60 to prevent sputtered material of the target from depositing on the anode. The annular gap 254 serves to enhance the preventive characteristics of the shield 250, in that a substantial buildup of sputtered material, sufficient to close the gap 254, would be necessary in order to cause an electrical short between the anode wall 28 and any sputtered material which coated the inner surface of the shield 250. In a like manner, a substantially identical sputter shield 260 having an axially projecting leg portion 262 which creates an annular gap 264 is disposed proximate the lower end of the target 60. The sputter shield 260 thus serves to inhibit the formation of a sputtered film which would cause an electrical short between the anode wall 48 and the lower jacket end cap 72.

The localized plasma zone 110 act to increase the sputtering of the cathode target material from the linear portions 202 of the inner wall 88 that are located nearest to the plasma zones 110. Owing to the linear nature of the plasma zones 110, the sputtering of the inner wall 88 in zones 202 tends to be uniform throughout a substantial portion of the length of the cathode target 60. Additionally, because the bar magnets 120, 122 and 124 are fixedly engaged to the inner wall 130 of the housing 132, and because the housing 132 rotates relative to the fixed cathode 60, the linear plasma zones 110 move rotationally around the inner surface 88 of the cathode target 60 as the housing 132 rotates relative to the cathode 60. Thus, it is to be understood that as the housing 132 rotates, the rotating plasma zones 110 create a uniform sputtering around the inner surface 88 of the cathode 60, resulting in a more economic usage of the cathode target material. The utilization of the rotating magnets thus results in more thorough use of the target 60 resulting in less down time while targets are replaced. Cathode cooling is significantly increased as sputtering from the portions 202 of the wall 88 is periodic rather than constant. This cooling results in increased throughput because more power can be delivered to the target without overheating the cathode material.

Figure 4:
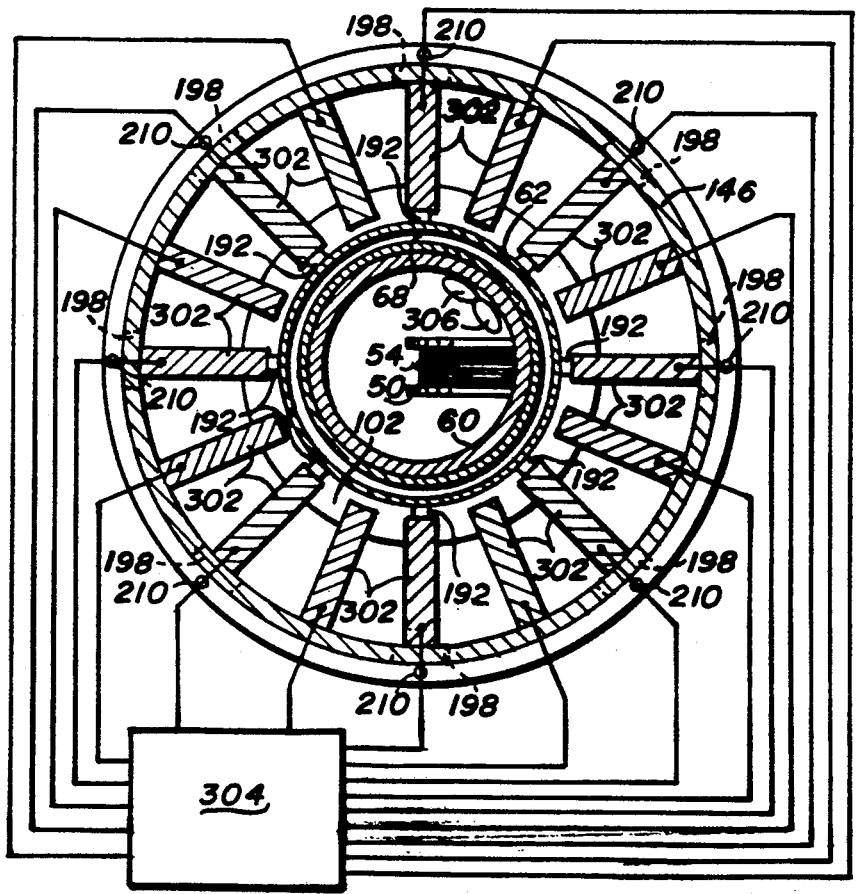
FIG. 4 is an alternative embodiment of the magnet configuration shown in a top cross-sectional view similar to FIG. 3.

While the invention has been shown and described utilizing bar magnets, it is within the contemplation of the inventor that electromagnets could be utilized as replacements for the bar magnets. As set forth hereinabove, a significant feature of the present invention is the creation of a long, narrow plasma zone that is disposed proximate a portion of the inner surface 88 of the target, while other portions of the inner surface 88 are not exposed to the plasma and are thus allowed to cool. The plasma zone is moved about the inner surface to promote even target sputtering and uniform coverage of the filament. An alternative method of moving the plasma is depicted in FIG. 4. It involves the placement of electromagnets 302 completely around the target 60 and an electrical timing circuit 304 that sequentially sends electrical energy to each electromagnet 302. In this manner the magnetic field 306 is made to rotate around the inner surface 88 of the target 60, thus achieving the same effect as the rotatable magnets of the preferred embodiment.

It is therefore to be understood that a significant feature of the present invention involves the simultaneous motion of the fiber 34 and the plasma zone 110. Owing to the localized nature of the sputtering zone 202 created by the plasma 110, the deposition of sputtered material upon the fiber at any given instant in time is not radially uniform. Rather, the sputtered material emanates only from the localized linear portion of the target surface 202 that is affected by the plasma zone 110, whereby a complete revolution of the plasma zone 110 around the centrally disposed fiber is required to uniformly coat the fiber. Thus, any point along the moving fiber must reside within the plasma zone portion of the target for a sufficient time duration for the plasma zone 110 to make one complete revolution. Therefore, for uniform fiber coating utilizing the present invention, a relationship exists between the speed with which the fiber travels through the target and the rotational speed of the magnet housing 132 (which controls the rotational speed of the plasma zone 110). In the preferred embodiment, it is desired that the time that it takes a point on the fiber to pass through the plasma zone of the target be an integer multiple of the time that it takes the housing 132 to complete a revolution. Thus, if the housing 132 completes a revolution in one-fifth of a second, it is desirable that the filament pass through the plasma zone in integer multiples of one-fifth of a second, such as one-fifth, two-fifths, three-fifths, four-fifths, etc. of a second. In the above example, if the time travel of the filament is one-fifth of a second, then one complete coating would be achieved; in two-fifths of a second, two coatings would be achieved; in three-fifths of a second, three coatings would be achieved, etc.

Alternative embodiments of the present invention will become apparent to those skilled in the art upon their understanding of this disclosure. It is within the contemplation of the invention that the bar magnets 120, 122 and 124, could be fixedly engaged to the outer housing 146, and thereby be immobilized. In this embodiment the target 60 would then be rotatably engaged within the deposition section 14. The localized plasma within the bore of the target 60 would then be movable relative to the inner surface 88 of the target bore where the magnetic field of the bar magnets is stationary and the inner surface 88 rotates relative to it.

In another alternative embodiment, it is contemplated that the filament 34 may be composed of an electrically conductive material. In such a situation, the filament 34 can be electrically connected to act as the anode, while the target is electrically connected to act as the cathode. The plasma would be struck in the target bore, between the anode and the cathode, and the localized magnetic field would create a localized plasma as has been described hereinabove.

While the invention has been particularly shown and described with reference to certain preferred embodiments, it will be understood by those skilled in the art that various operations and modifications in form and detail may be made therein. Accordingly, it is intended that the following claims cover all such alterations and modifications as fall within the true spirit and scope of the invention.

What is claimed is:

1. A hollow-cathode magnetron, comprising:
    a target holding means being adapted to engage a substantially cylindrically shaped target;
    a substantially cylindrically shaped target having a central axis therewithin and an axially disposed bore formed therethrough, said bore being coaxially formed with said central axis of said cylindrical target, said target being engaged to said target holding means;
    plasma forming means being disposed within said magnetron and functioning to create a plasma within said bore;
    magnetic means functioning to influence the location of said plasma within said bore, whereby a localized plasma zone is created proximate an arcuate wall section within said bore proximate said magnetic means, said plasma zone having a narrow, linear shape that is oriented generally parallel to said central axis, said magnetic means and said target being cooperatively disposed relative to each other such that the location of said localized plasma zone is movable within said bore.

2. A hollow-cathode magnetron as described in claim 1 wherein said target is engaged in a stationary position and said magnetic means is engaged in a movable manner relative to said target.

3. A hollow-cathode magnetron as described in claim 2 wherein said magnetic means is engaged to a first housing;
    said first housing being cylindrical in shape and engaged to rotate about said target in coaxial relationship with said target bore.

4. A hollow-cathode magnetron as described in claim 1 wherein said magnetic means includes at least one magnet.

5. A hollow-cathode magnetron as described in claim 4 wherein at least one of said magnets comprises a permanent bar magnet having a first longitudinal edge of one magnetic polarity and a second longitudinal edge of an opposite magnetic polarity;
    said first longitudinal edge being disposed in a parallel relationship relative to said central axis of said cylindrical target.

6. A hollow-cathode magnetron as described in claim 5 wherein said magnetic means includes three said permanent bar magnets being disposed adjacent to each other;
    each said bar magnet having a first longitudinal edge which differs in polarity from said firs longitudinal edge of each said bar magnet disposed adjacent to another said bar magnet.

7. A hollow-cathode magnetron as described in claim 1 wherein said magnetic means is disposed in a stationary position and said target is engaged in a movable manner relative to said magnetic means.

8. A hollow-cathode magnetron as described in claim 1 wherein said plasma forming means includes at least one anode and at least one cathode, said anode and said cathode having an electrical potential imposed therebetween, such that a plasma is sustained within said bore by said electrical potential.

9. A hollow-cathode magnetron as described in claim 8 wherein a sputtering shield means is disposed between said cathode and said anode, said shield means functioning to inhibit the buildup of a layer of sputtered material between said anode and said cathode, whereby the occurrence of an electrical short between said anode and said cathode is prevented.

10. A hollow-cathode magnetron as described in claim 1 wherein said magnetic means includes a plurality of electromagnets, each said electromagnet being disposed proximate said target;
    said magnetic means also including a sequential electromagnetic energizing means functioning to sequentially, electrically energize said electromagnets, whereby a localized magnetic field is created within said bore, and said localized magnetic field moves about said bore in direct relation to said sequential energizing means, said localized magnetic field functioning to induce the creation of said localized plasma.

11. A hollow-cathode magnetron, comprising:
    a target holding means being adapted to engage a substantially cylindrically shaped target, said target holding means including a target cooling means disposed therewithin;
    a substantially cylindrically shaped target having a central axis therewithin and an axially disposed bore formed therethrough, said bore being coaxially formed with said central axis of said cylindrical target, said target being engaged to said target holding means;

plasma forming means being disposed within said magnetron and functioning to create a plasma within said bore of said target, said plasma forming means including at least one anode and at least one cathode, said anode and said cathode having an electrical potential imposed therebetween, such that a plasma is sustained within said bore by said electrical potential;

magnetic means being disposed within said magnetron proximate said target and functioning to influence the location of said plasma within said bore, whereby a localized plasma zone, having a narrow, linear shape that is oriented generally parallel to said central axis, is created proximate an arcuate wall section within said bore, and the location of said localized plasma is movable within said bore;

said magnetic means including at least one magnet having a first longitudinal edge of one magnetic polarity and a second longitudinal edge of an opposite magnetic polarity, said first longitudinal edge being disposed in a parallel relationship relative to said central axis of said cylindrical target.

12. A hollow-cathode magnetron as described in claim 11 wherein said target is engaged in a stationary position and said magnetic means is engaged in a movable manner relative to said target.

13. A hollow-cathode magnetron as described in claim 12 wherein said magnetic means is engaged to a first housing;

said first housing being cylindrical in shape and engaged to rotate about said target in coaxial relationship with said target bore.

14. A hollow-cathode magnetron as described in claim 11 wherein said magnetic means includes three said permanent bar magnets being disposed adjacent to each other;

each said magnet having a first longitudinal edge which differs in polarity from said first longitudinal edge of each adjacent magnet.

15. A hollow-cathode magnetron as described in claim 11 wherein said magnetic means is disposed in a stationary position and said target is engaged in a movable manner relative to said magnetic means.

16. A hollow-cathode magnetron as described in claim 11 wherein a sputtering shield means is disposed between said cathode and said anode, said shield means functioning to inhibit the buildup of a layer of sputtered material between said anode and said cathode whereby the occurrence of an electrical short between said anode and said cathode is prevented.

17. A hollow-cathode magnetron as described in claim 11 wherein said magnetic means includes a plurality of electromagnets, each said electromagnet being disposed proximate said target;

said magnetic means also including a sequential electromagnetic energizing means functioning to sequentially, electrically energize said electromagnets, whereby a localized magnetic field is created within said bore, and said localized magnetic field moves about said bore in direct relation to said sequential energizing means, said localized magnetic field functioning to induce the creation of said localized plasma.

18. A hollow-cathode magnetron, comprising:

an input section, said input section being formed as a hollow cylindrical structure having an end cap that is removably sealingly engaged thereto;

an input spool means, said input spool means being adapted for holding a spooled quantity of a continuous material that is to be coated within said magnetron, said input spool means being removably engaged within said input section;

an output section, said output section being formed as a hollow cylindrical structure having an end cap that is removably sealingly engaged thereto;

an output spool means, said output spool means being adapted for holding a spooled quantity of a continuous material that has been coated within said magnetron, said output spool means being removably engaged within said output section;

a deposition section, said deposition section being disposed in pneumatic communication between said input section and said output section, whereby a low pressure environment may be established and maintained throughout said input section, said deposition section and said output section; said continuous material extending from said input spool through said deposition section to said output spool;

a target means, said target means being cylindrical in shape and having a central axis and a target sputtering bore formed therethrough in coaxial alignment with said central axis of said target means;

a target holding means, said target holding means being disposed within said deposition section and functioning to hold said target means within said deposition section;

plasma forming means, said plasma forming means including an electrical means for the establishment of an electrical potential between said target holding means on the one hand and said input section and said outputs section on the other hand;

magnetic means, said magnetic means being engaged within said deposition section and functioning to influence the location of said plasma within said bore of said target, whereby a localized plasma zone, having a narrow, linear shape that is oriented generally parallel to said central axis, is created proximate an arcuate wall section within said bore; said magnetic means and said target means being cooperatively disposed relative to each other, such that the location of said localized plasma is movable within said bore.

19. A hollow-cathode magnetron as described in claim 18 wherein said target means is engaged in a stationary position and said magnetic means is engaged in a movable manner relative to said stationary target means.

20. A hollow-cathode magnetron as described in claim 19 wherein said magnetic means is engaged to a first housing, said first housing being cylindrical in shape and engaged to rotate about said target means in coaxial relationship with said target bore;

a second housing, said second housing being statically engaged within said deposition section;

said first housing being rotatably engaged to said second housing.

21. A hollow-cathode magnetron as described in claim 18 wherein said magnetic means includes at least one magnet.

22. A hollow-cathode magnetron as described in claim 21 wherein at least one of said magnets comprises a permanent bar magnet having a first longitudinal edge of one magnetic polarity and a second longitudinal edge of an opposite magnetic polarity;

said first longitudinal edge being disposed in a parallel relationship relative to said central axis of said cylindrical bore.

23. A hollow-cathode magnetron as described in claim 22 wherein said magnetic means includes three said permanent bar magnets being disposed adjacent to each other;

each said magnet having a first longitudinal edge which differs in polarity from said first longitudinal edge of each adjacent magnet.

24. A hollow-cathode magnetron as described in claim 18 wherein said magnetic means is disposed in a stationary position and said target is engaged in a movable manner relative to said magnetic means.

25. A hollow-cathode magnetron as described in claim 18 wherein said input section and said output section are electrically connected to each function as an anode and said target holding means is electrically connected to function as a cathode, said anodes and said cathode having an electrical potential imposed therebetween, such that a plasma is sustained within said bore by said electrical potential.

26. A hollow-cathode magnetron as described in claim 25 wherein a sputtering shield means is disposed between said target means and said anode, said shield means functioning to inhibit the buildup of a layer of sputtered material between said anode and said cathode whereby the occurrence of an electrical short between said anode and said cathode is prevented.

27. A hollow-cathode magnetron as described in claim 18 wherein said magnetic means includes a plurality of electromagnets, each said electromagnet being disposed proximate said target;

said magnetic means also including a sequential electromagnetic energizing means functioning to sequentially, electrically energize said electromagnets, whereby a localized magnetic field is created within said bore, and said localized magnetic field moves about said bore in direct relation to said sequential energizing means, said localized magnetic field functioning to induce the creation of said localized plasma.

28. A sputtering shield for engagement within a sputtering device proximate a sputtering target for preventing electrical shorts between electrically active elements within said sputtering device, comprising:

a base, said base comprising a portion of said shield, and being formed for engagement within said sputtering device adjacent to said target;

a leg portion, said leg portion extending from said base;

said leg portion projecting into a space between said target and at least one of said electrically active elements to create a shielded electrically active element, whereby the deposition of sputtered material from said target upon said shielded electrically active element is inhibited.

29. A sputtering shield as described in claim 28 wherein said leg portion is disposed in a spaced apart position relative to said shielded electrically active element.

30. A method for depositing a film upon a thin, linear object, comprising:

placing said object within a sputtering bore of a hollow, cylindrical target, said target having a central axis therethrough;

creating a localized plasma within said sputtering bore and proximate an arcuate wall section of an inner surface of said sputtering bore thereof, said plasma having a narrow, linear shape that is oriented generally parallel to said central axis;

moving said localized plasma relative to said inner surface of said sputtering bore, whereby portions of said inner surface proximate said localized plasma are exposed to said plasma for sputtering, while other portions of said inner surface being disposed away from said localized plasma are not simultaneously sputtered.

31. A method for depositing a film as described in claim 30 wherein said step of moving said localized plasma includes the steps of:

creating a localized magnetic field proximate a portion of said inner surface of said bore, and moving said inner surface and said magnetic field relative to each other, whereby said localized plasma will follow said magnetic field, such that those portions of said inner surface proximate said magnetic field are exposed to said plasma.

32. A method for depositing a film as described in claim 31 wherein said step of creating said localized magnetic field includes the steps of:

engaging a magnetic field generating means proximate a portion of said cylindrical target; and said step of moving said inner surface relative to said localized magnetic field includes the steps of:

fixedly engaging said target, and movably engaging said magnetic field generating means relative to said target.

33. A method for depositing a film as described in claim 32 wherein said step of movably engaging said magnetic field generating means includes the steps of:

fixedly engaging said magnetic field generating means to a movable housing, said movable housing being engaged to rotate about said cylindrical target.

34. A method for depositing a film as described in claim 33 wherein said magnetic field generating means includes at least one magnet, said magnet being engaged to said housing such that a long, narrow, magnetic field is created within said bore, the length of said field being disposed in a parallel orientation relative to the central axis of said cylindrical target.

35. A method for depositing a thin film as described in claim 31 wherein said step of creating said localized magnetic field includes the step of:

engaging a magnetic field generating means proximate a portion of said cylindrical target; and said step of moving said inner surface relative to said localized magnetic field includes the steps of:

fixedly engaging said magnetic field generating means, and movably engaging said target relative to said magnetic field generating mans.

36. A method for depositing a film as described in claim 31 wherein said step of creating said localized magnetic field includes the steps of:

engaging a magnetic field generating means proximate to and surrounding said cylindrical target; and said step of moving said inner surface relative to said localized magnetic field includes the steps of:

fixedly engaging said target, and electrically energizing portions of said magnetic field generating means in a sequential manner about said target, whereby said magnetic field is localized relative to portions of said target and moves about said target in direct relation to said sequential activation of said magnetic field generating means.

37. A method for depositing a film as described in claim 36 wherein said magnetic field generating means includes a plurality of electromagnets, each said electromagnet being disposed proximate said target, such that said target is surrounded by said plurality of electromagnets;

a sequential activation device, said sequential activation device being engaged in electrical connection with said plurality of electromagnets and functioning to activate said electromagnets in a sequential pattern around said target.

* * * * *